United States Patent
Chang et al.

(10) Patent No.: US 8,815,379 B2
(45) Date of Patent: Aug. 26, 2014

(54) COATED ARTICLE AND METHOD FOR MAKING SAME

(75) Inventors: Hsin-Pei Chang, New Taipei (TW); Cheng-Shi Chen, New Taipei (TW); Cong Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 247 days.

(21) Appl. No.: 13/238,164

(22) Filed: Sep. 21, 2011

(65) Prior Publication Data

US 2013/0029094 A1 Jan. 31, 2013

(30) Foreign Application Priority Data

Jul. 29, 2011 (CN) .......................... 2011 1 0215440

(51) Int. Cl.
  *B32B 9/00* (2006.01)

(52) U.S. Cl.
  USPC ........... 428/216; 428/336; 428/469; 428/472; 428/698

(58) Field of Classification Search
  USPC .......................... 428/216, 336, 469, 472, 698
  See application file for complete search history.

(56) References Cited

U.S. PATENT DOCUMENTS

| 4,763,601 | A | * | 8/1988 | Saida et al. | 118/718 |
| 5,079,089 | A | * | 1/1992 | Ito et al. | 428/336 |
| 5,427,843 | A | * | 6/1995 | Miyajima et al. | 428/469 |
| 6,087,018 | A | * | 7/2000 | Uchiyama | 428/469 |
| 2002/0192473 | A1 | * | 12/2002 | Gentilhomme et al. | 428/216 |
| 2007/0275264 | A1 | * | 11/2007 | Hultin et al. | 428/687 |
| 2008/0038579 | A1 | * | 2/2008 | Schuisky et al. | 428/640 |
| 2009/0181262 | A1 | * | 7/2009 | Isaksson et al. | 428/626 |

FOREIGN PATENT DOCUMENTS

JP  02-122064  *  5/1990

* cited by examiner

*Primary Examiner* — Archene Turner
(74) *Attorney, Agent, or Firm* — Novak Druce Connolly Bove + Quigg LLP

(57) ABSTRACT

A coated article includes a substrate, a first layer formed on the substrate, and a second layer deposited on the first layer. The substrate comprises a first outer surface. The substrate defines a plurality of first convexes in the first outer surface. The first layer comprises a second outer surface away from the first outer surface. The second outer surface of the first layer defines a plurality of second convexes corresponding to the first convexes in the position. The second layer substantially includes substance M, O, and N, wherein M is Al or Si.

14 Claims, 2 Drawing Sheets

COATED ARTICLE AND METHOD FOR MAKING SAME

CROSS-REFERENCE TO RELATED APPLICATIONS

This application is one of the six related co-pending U.S. patent applications listed below. All listed applications have the same assignee. The disclosure of each of the listed applications is incorporated by reference into the other listed applications.

| U.S. application Ser. No. | Title | Inventors |
| --- | --- | --- |
| 13/238,157 | COATED ARTICLE AND METHOD FOR MAKING SAME | HUANN-WU CHIANG et al. |
| 13/238,160 | COATED ARTICLE AND METHOD FOR MAKING SAME | HUANN-WU CHIANG et al. |
| 13/238,164 | COATED ARTICLE AND METHOD FOR MAKING SAME | HSIN-PEI CHANG et al. |
| 13/238,169 | COATED ARTICLE AND METHOD FOR MAKING SAME | WEN-RONG CHEN et al. |
| 13/238,170 | COATED ARTICLE AND METHOD FOR MAKING SAME | HSIN-PEI CHANG et al. |
| 13/238,176 | COATED ARTICLE AND METHOD FOR MAKING SAME | WEN-RONG CHEN et al. |

BACKGROUND

1. Technical Field

The exemplary disclosure generally relates to coated articles and a method for manufacturing the coated articles, particularly coated articles having a bone china appearance and a method for making the coated articles.

2. Description of Related Art

Anodic treatment and sand blasting are used to form convex-concave configuration on housings of portable electronic devices. A white layer can be deposited on the housings via spraying painting or physical vapor deposition so the housings can present with a bumpy and white appearance. However, the housings cannot present a high level of whiteness, brightness, and translucent appearance like a bone china.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary coated article and method for manufacturing the coated article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
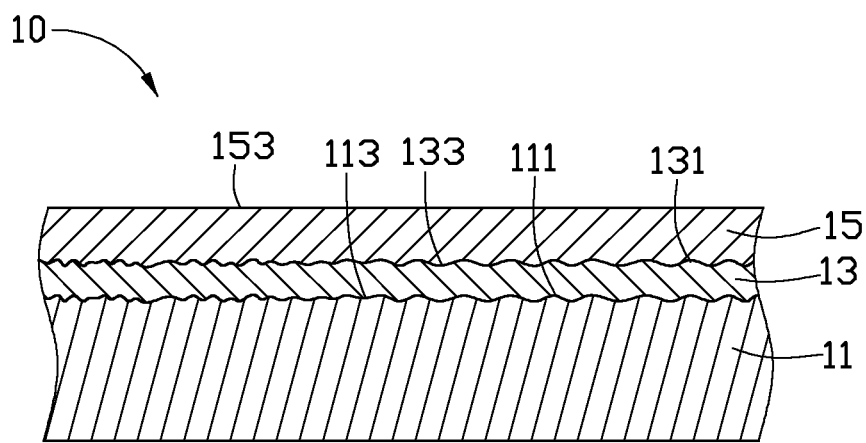
FIG. 1 is a cross-sectional view of an exemplary embodiment of coated article.

FIG. 1 shows an exemplary embodiment of a coated article. The coated article 10 includes a substrate 11, a first layer 13 formed on the substrate 11 and a second layer 15 formed on the first layer 13. The coated article 10 may be a housing of a mobile phone, personal digital apparatus (PDA), notebook computer, portable music players, GPS navigator, or digital camera.

The substrate 11 may be made of metal, such as stainless steel, aluminum, aluminum alloy, magnesium and magnesium alloy. The substrate 11 comprising a first outer surface 113. The substrate 11 defines a plurality of first convexes 111 in the first outer surface 113, so that the first outer surface 113 is alternating with concave portions and the first convexes 111. The first convexes 111 are formed by anodic treatment, sand blasting, chemical etching, or laser engraving.

The first layer 13 is a color layer. The first layer 13 is formed by spray painting or physical vapor deposition. The first layer 13 has an L* value between about 85 to about 91, an a* value between about −0.5 to about 0.5, and a b* value between about −0.5 to about 0.5 in the CIE L*a*b* (CIE LAB) color space. The first layer 13 may be presented with a white china-like appearance. The first layer 13 comprises a second outer surface 133 away from the first outer surface 113 of the substrate 11. The second outer surface 133 of the first layer 13 defines a plurality of second convexes 131 corresponding to the first convexes 111. In other words, protrusion of each second convex 131 on the second outer surface 111 of the substrate 11 is overlapped with one corresponding first convex 111.

When the first layer 13 is sprayed on the substrate 11, the paint used for the first layer 13 may be heat-curing paint or ultraviolet curable paint. The first layer 13 has a thickness of about 3 μm to about 8 μm. When the first layer 13 is deposited on the substrate 11 by physical vapor deposition, the first layer 13 has a thickness of about 1 μm to about 2 μm.

The second layer 15 substantially includes substance M, oxygen (O) and nitrogen (N), wherein M is aluminum (Al) or silicon (Si). If M is Al, the mass percentage of Al is about 60%-70%, the mass percentage of O is about 25%-28% and the mass percentage of N is about 2%-15%. If M is Si, the mass percentage of Si is about 65%-75%, the mass percentage of O is about 17%-22% and the mass percentage of N is about 3%-18%. The second layer 15 includes a third outer surface 153. The mean particle diameter of a third outer surface 153 is about 10 nm to about 18 nm. The surface roughness (Ra) of the third outer surface 153 is about 10 nm to about 20 nm.

The second layer 15 is transparent and colorless. The second layer 15 is deposited by physical vapor deposition methods such as magnetron sputtering, vacuum evaporation or, arc ion plating. The second layer 15 has a thickness of about 2 μm to about 4 μm.

The 60 degree specula gloss (Gs 60°) of the second layer 15 is about 85-100. The coated article 10 has an L* value between about 85 to about 91, an a* value between about −0.5 to about 0.5, and a b* value between about −0.5 to about 0.5 in the CIE LAB.

The substrate 11, the first layer 13 combined with the second layer 15 causes the coated article 10 to present a bumpy, high level of whiteness and brightness, and translucent appearance like bone china.

A method for manufacturing the coated article 10 may include at least the following steps:

Providing a substrate 11. The substrate 11 may be made of metal, such as stainless steel, aluminum, aluminum alloy, magnesium and magnesium alloy.

Pretreating the substrate 11 by washing with a solution (e.g., alcohol or acetone) in an ultrasonic cleaner to remove contaminations, such as grease, or dirt. The substrate 11 is then dried.

Treating the substrate 11 by anodic treatment, sand blasting, chemical etching, or laser engraving to form a plurality of first convexes 111 in the first outer surface 113.

The first layer 13 is sprayed on the substrate 11. The paint used for the first layer 13 may be heat-curing paint or ultraviolet curable paint. The thickness of the first layer 13 may be about 3 μm to about 8 μm. The second outer surface 133 of the first layer 13 defines a plurality of second convexes 131 in the position corresponding to the first convexes 111.

Figure 2:
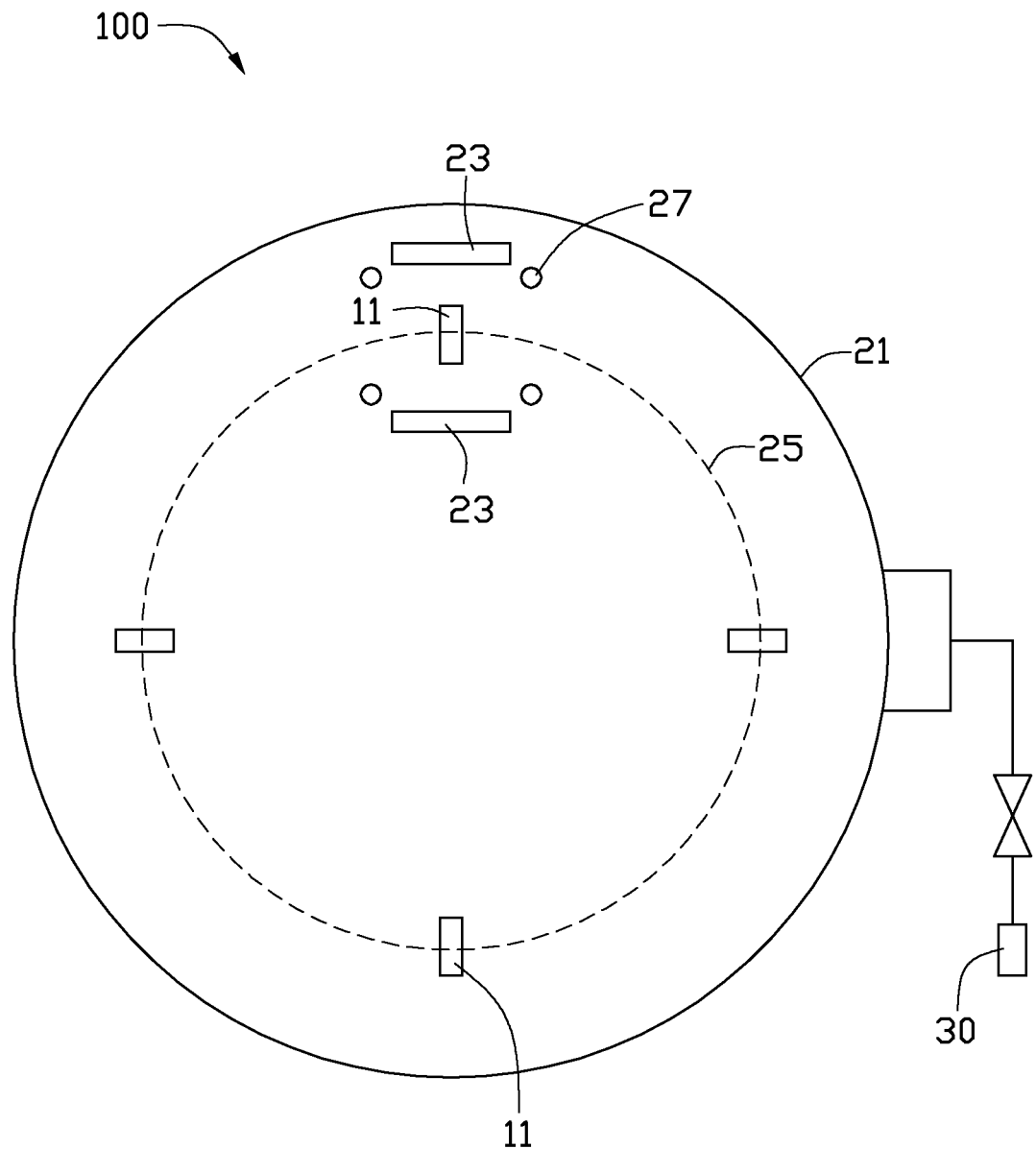
FIG. 2 is a schematic view of a vacuum sputtering coating machine for manufacturing the coated article of FIG. 1.

Providing a vacuum sputtering coating machine 100. Referring to FIG. 2, the vacuum sputtering coating machine 100 includes a sputtering coating chamber 21 and a vacuum pump 30 connected to the sputtering coating chamber 21. The vacuum pump 30 is used to evacuate the sputtering coating chamber 21. The vacuum sputtering coating machine 100 further includes two targets 23, a rotating bracket 25, and a plurality of gas inlets 27. The rotating bracket 25 rotates the substrate 11 in the sputtering coating chamber 21 relative to the targets 23. The two targets 23 face each other, and are located on opposite sides of the rotating bracket 25. In the exemplary embodiment, the targets 23 are made of Al, Al alloy, Si or Si alloy. If the targets 23 are made of Al alloy or Si alloy, the mass percentage of the Al or Si is about 65%-80%.

The second layer 15 is deposited on the first layer 13. The substrate 11 is retained on a rotating bracket 25 in a sputtering coating chamber 21. The temperature in the sputtering coating chamber 21 is set between about 20° C. (Celsius degrees) and about 200° C. Argon may be used as a working gas and is injected into the sputtering coating chamber 21 at a flow rate from about 100 sccm to about 300 sccm. Nitrogen ($N_2$) and oxygen ($O_2$) may be used as reaction gases. The nitrogen may have a flow rate of about 80 sccm to about 200 sccm, the oxygen may have a flow rate of about 80 sccm to about 200 sccm. The targets 23 in the sputtering coating chamber 21 are evaporated at a power between about 8 kW and about 12 kW. A bias voltage applied to the substrate 11 may be between about −100 V and about −300 V, for between about 60 minutes (min) and about 80 min, to deposit the second layer 15 on the first layer 13. The second layer 15 has a thickness of about 2 μm to about 4 μm.

Polishing the third outer surface 153 to increase glossiness and transparency of the second layer 15. Providing a finishing and polishing machine (not shown). The finishing and polishing machine includes a canvas polishing wheel. Polishing fluid is coated in the outer surface of the canvas polishing wheel to polishing the third outer surface 153 for about 10 min to about 50 min. The polishing fluid is a suspension, which substantially comprises alumina powder and water. The 60 degree specula gloss (Gs 60°) of the second layer 15 is about 85-100 after the polishing process.

It is to be understood that the first layer 13 may instead be deposited by physical vapor deposition methods, and the thickness of the first layer 13 is about 1 nm to about 2 nm.

It is to be understood that the second layer 15 may also be deposited by vacuum evaporation or arc ion plating.

The substrate 11, the first layer 13 combined with the second layer 15 causes the coated article 10 to present a convex concave and high level of whiteness, brightness and translucent appearance like bone china. Thus, the coated article 10 may overcome the appearance defects related to the coated article 10 manufactured by anodizing, sand blasting, chemical etching or laser engraving process.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A coated article, comprising:
 a substrate, the substrate comprising a first outer surface, the substrate defining a plurality of first convexes in the first outer surface;
 a first layer formed on the substrate, the first layer comprising a second outer surface away from the first outer surface, the second outer surface of the first layer defining a plurality of second convexes corresponding to the first convexes; and
 a second layer deposited on the first layer, the second layer substantially including substance M, O and N, wherein M is Al or Si.

2. The coated article as claimed in claim 1, wherein the first layer is formed by spraying painting or physical vapor deposition.

3. The coated article as claimed in claim 1, wherein the first layer has an L* value between about 85 to about 91, an a* value between about −0.5 to about 0.5, and a b* value between about −0.5 to about 0.5 in the CIE L*a*b* color space.

4. The coated article as claimed in claim 1, wherein the first layer has a thickness of about 3 μm to about 8 μm, when the first layer formed by spraying painting.

5. The coated article as claimed in claim 1, wherein the first layer has a thickness of about 1 μm to about 2 μm, when the first layer formed by physical vapor deposition.

6. The coated article as claimed in claim 1, wherein the second layer is deposited by physical vapor deposition.

7. The coated article as claimed in claim 1, wherein M is Al, the mass percentage of Al is about 60%-70%, the mass percentage of O is about 25%-28% and the mass percentage of N is about 2%-15%.

8. The coated article as claimed in claim 1, wherein M is Si, the mass percentage of Si is about 65%-75%, the mass percentage of O is about 17%-22% and the mass percentage of N is about 3%-18%.

9. The coated article as claimed in claim 1, wherein the second layer comprising a third outer surface away from the second layer, the mean particle diameter of the third outer surface is about 10 nm to about 18 nm.

10. The coated article as claimed in claim 1, wherein the second layer having a third outer surface away from the second layer, the surface roughness of the third outer surface is about 10 nm to about 20 nm.

11. The coated article as claimed in claim 1, wherein the 60 degree specula gloss of the second layer is about 85-100.

12. The coated article as claimed in claim 1, wherein the coated article has an L* value between about 85 to about 91, an a* value between about −0.5 to about 0.5, and a b* value between about −0.5 to about 0.5 in the CIE LAB.

13. The coated article as claimed in claim 1, wherein the second layer has a thickness of about 2 μm to about 4 μm.

14. A coated article, comprising:
 a substrate, the substrate comprising a first outer surface, the substrate defining a plurality of first convexes in a first outer surface;

a first layer formed on the substrate, the first layer comprising a second outer surface away from the first outer surface, the second outer surface defining a plurality of second convexes, protrusion of each second convex on the first outer surface being overlapped with one corresponding first convex; and a second layer deposited on the first layer, the second layer substantially including substance M, O and N, wherein M is Al or Si.

* * * * *